United States Patent
Ishii

(10) Patent No.: US 11,791,406 B2
(45) Date of Patent: Oct. 17, 2023

(54) SEMICONDUCTOR DEVICE

(71) Applicant: FUJI ELECTRIC CO., LTD., Kawasaki (JP)

(72) Inventor: Kenichi Ishii, Matsumoto (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 57 days.

(21) Appl. No.: 17/334,240

(22) Filed: May 28, 2021

(65) Prior Publication Data

US 2022/0020869 A1 Jan. 20, 2022

(30) Foreign Application Priority Data

Jul. 15, 2020 (JP) .................................. 2020-121742

(51) Int. Cl.
*H01L 27/06* (2006.01)
*H01L 21/331* (2006.01)
*H01L 29/739* (2006.01)
*H01L 23/522* (2006.01)
(Continued)

(52) U.S. Cl.
CPC ...... *H01L 29/7397* (2013.01); *H01L 23/5226* (2013.01); *H01L 29/7811* (2013.01); *H01L 29/861* (2013.01); *H01L 29/8613* (2013.01)

(58) Field of Classification Search
CPC .......... H01L 29/66325–66348; H01L 29/7393–7398; H01L 2924/13055; H01L 29/083–0834; H01L 29/66121; H01L 29/66136; H01L 2924/12036; H01L 29/7801; H01L 29/7816; H01L 29/7825; H01L 29/66674; H01L 29/73; H01L 29/735; H01L 29/7394; H01L 29/7395; (Continued)

(56) References Cited

U.S. PATENT DOCUMENTS 4,774,556 A * 9/1988 Fujii ................... H01L 29/7883
257/E29.302
5,381,026 A * 1/1995 Shinohe .............. H01L 29/7455
257/148
(Continued)

FOREIGN PATENT DOCUMENTS

JP 2012-134198 A 7/2012
JP 2018-157043 A 10/2018

*Primary Examiner* — Mary A Wilczewski
*Assistant Examiner* — Tsz K Chiu
(74) *Attorney, Agent, or Firm* — Rabin & Berdo, P.C.

(57) ABSTRACT

A first gate wiring layer is a 2-layered structure in which a polysilicon wiring layer and a metal wiring layer containing aluminum are sequentially stacked. The polysilicon wiring layer and the metal wiring layer surround a periphery of an active region. In a portion of a periphery of the first gate wiring layer, the polysilicon wiring layer and the metal wiring layer contact each other via a contact hole of an interlayer insulating film and in remaining portions thereof, are electrically insulated from each other by the interlayer insulating film. The first gate wiring layer, in portion separate from a gate pad, is configured having relatively more of the metal wiring layer with a resistance value lower than that of the polysilicon wiring layer. The resistance value of the first gate wiring layer is adjusted to be relatively high in a portion near the gate pad, as compared to the portion separate from the gate pad.

9 Claims, 9 Drawing Sheets

(51) Int. Cl.
*H01L 29/861* (2006.01)
*H01L 29/78* (2006.01)

(58) Field of Classification Search
CPC ............. H01L 29/7397; H01L 23/5226; H01L 29/861; H01L 29/407; H01L 29/8613
See application file for complete search history.

(56) References Cited

U.S. PATENT DOCUMENTS

| | | | | |
|---|---|---|---|---|
| 5,554,862 | A * | 9/1996 | Omura | H01L 29/7455 257/163 |
| 5,895,951 | A * | 4/1999 | So | H01L 29/7813 257/E29.066 |
| 6,114,727 | A * | 9/2000 | Ogura | H01L 29/0696 257/E29.198 |
| 6,153,896 | A * | 11/2000 | Omura | H01L 29/7395 257/E29.198 |
| 6,359,306 | B1 * | 3/2002 | Ninomiya | H01L 29/7824 257/E29.066 |
| 6,710,403 | B2 * | 3/2004 | Sapp | H01L 29/7813 257/341 |
| 6,818,945 | B2 * | 11/2004 | Kawaguchi | H01L 29/7813 257/E29.066 |
| 7,675,113 | B2 * | 3/2010 | Sakamoto | H01L 29/0696 257/341 |
| 7,714,365 | B2 * | 5/2010 | Werner | H01L 29/7816 257/256 |
| 7,800,183 | B2 * | 9/2010 | Okuno | H01L 29/7397 257/E29.198 |
| 8,878,476 | B2 * | 11/2014 | Hirose | H02M 1/32 318/400.26 |
| 9,287,354 | B2 * | 3/2016 | Hirler | H01L 29/1095 |
| 9,478,649 | B2 * | 10/2016 | Li | H01L 21/02236 |
| 9,496,421 | B2 * | 11/2016 | Carta | H01L 24/37 |
| 9,865,591 | B2 * | 1/2018 | Horikawa | H01L 29/41 |
| 10,043,872 | B2 * | 8/2018 | Tanaka | H01L 29/0634 |
| 10,957,773 | B1 * | 3/2021 | Matsushita | H01L 29/7811 |
| 11,063,122 | B2 * | 7/2021 | Yamashiro | H01L 27/04 |
| 2002/0024056 | A1 * | 2/2002 | Miyakoshi | H01L 29/0619 257/E29.066 |
| 2002/0096741 | A1 * | 7/2002 | Yamaguchi | H01L 29/0834 257/E29.037 |
| 2005/0161761 | A1 * | 7/2005 | Hatade | H01L 29/7816 257/490 |
| 2006/0076629 | A1 * | 4/2006 | Yilmaz | H01L 27/092 257/E29.034 |
| 2007/0114570 | A1 * | 5/2007 | Yamaguchi | H01L 29/0839 257/E29.198 |
| 2009/0189181 | A1 * | 7/2009 | Koyama | H01L 29/0696 257/E29.197 |
| 2010/0187640 | A1 * | 7/2010 | Miyata | H01L 29/7808 257/401 |
| 2010/0314659 | A1 * | 12/2010 | Yilmaz | H01L 29/4236 257/E29.198 |
| 2011/0049562 | A1 * | 3/2011 | Suzuki | H01L 29/7395 257/E27.053 |
| 2012/0153349 | A1 * | 6/2012 | Suzuki | H01L 29/404 257/140 |
| 2012/0292662 | A1 * | 11/2012 | Matsuura | H01L 29/1095 257/E29.198 |
| 2013/0175574 | A1 * | 7/2013 | Matsuura | H01L 29/66348 438/138 |
| 2014/0291757 | A1 * | 10/2014 | Hirabayashi | H01L 29/861 257/330 |
| 2015/0145025 | A1 * | 5/2015 | Yoshida | H01L 27/088 257/329 |
| 2015/0206960 | A1 * | 7/2015 | Hirabayashi | H01L 27/0727 257/140 |
| 2015/0270387 | A1 * | 9/2015 | Kumada | H01L 29/7397 257/140 |
| 2016/0111529 | A1 * | 4/2016 | Hirabayashi | H01L 29/7397 257/139 |
| 2016/0293751 | A1 * | 10/2016 | Siemieniec | H01L 29/8613 |
| 2017/0271452 | A1 * | 9/2017 | Nishimura | H01L 29/0696 |
| 2021/0013196 | A1 * | 1/2021 | Hoshi | H01L 27/0255 |

* cited by examiner

SEMICONDUCTOR DEVICE

CROSS REFERENCE TO RELATED APPLICATIONS

This application is based upon and claims the benefit of priority of the prior Japanese Patent Application No. 2020-121742, filed on Jul. 15, 2020, the entire contents of which are incorporated herein by reference.

BACKGROUND OF THE INVENTION

1. Field of the Invention

Embodiments of the invention relate to a semiconductor device.

2. Description of the Related Art

Conventionally, a control signal (control voltage) for turning ON/OFF (switching) a semiconductor device is transmitted from an electrode pad on a front surface of a semiconductor substrate (semiconductor chip), through a wiring layer, to unit cells of the semiconductor device (functional units of the semiconductor device). The wiring layer is disposed on the front surface of the semiconductor substrate, in a substantially rectangular shape surrounding a periphery of an active region. A portion of the wiring layer is formed using a low-resistance metal material such as aluminum (Al). The active region is a region through which current flows when the semiconductor device is ON and multiple unit cells are connected in parallel.

For example, in a MOS-type semiconductor device such as a metal oxide semiconductor field effect transistor (MOSFET) having insulated gates each having a 3-layered structure including a metal, an oxide film, and a semiconductor, or in an insulated gate bipolar transistor (IGBT), a gate wiring layer is disposed on the front surface of the semiconductor substrate; and gate signals (gate voltage) supplied to a gate pad are conveyed to gate electrodes by the gate wiring layer.

A structure of a conventional semiconductor device is described taking, as an example, a semiconductor substrate on which an IGBT is fabricated (manufactured). FIG. 14 is a plan view depicting a state when the conventional semiconductor device is viewed from a front surface of a semiconductor substrate thereof. FIGS. 15 and 16 are cross-sectional views of the structure of a gate wiring layer in FIG. 14. FIG. 15 depicts a cross-section of the structure along cutting line AA-AA' that is parallel to a direction orthogonal to a gate wiring layer 133 (in FIG. 14, a first direction X). FIG. 16 depicts the structure along cutting line BB-BB' that is parallel to a direction in which the gate wiring layer 133 extends (in FIG. 14, a second direction Y).

A conventional semiconductor device 120 depicted in FIG. 14 includes in an active region 121, multiple IGBT unit cells connected in parallel on a semiconductor substrate (semiconductor chip) 110 and includes on a front surface of the semiconductor substrate 110, an emitter pad 111, a gate pad 112, and the first and second gate wiring layers 133, 134. The active region 121 is disposed in substantially a center of the semiconductor substrate 110. Between the active region 121 and an end of the semiconductor substrate 110 (chip end) is an edge voltage withstanding structure region 122. The edge voltage withstanding structure region 122 surrounds a periphery of the active region 121.

The emitter pad 111, the gate pad 112, and the second gate wiring layer 134 are disposed separate from one another in the active region 121. The emitter pad 111 and the gate pad 112 are metal layers containing aluminum. The second gate wiring layer 134 is a single-layer polysilicon (poly-Si) wiring layer. The first gate wiring layer 133 is disposed in the edge voltage withstanding structure region 122. The first gate wiring layer 133 has a 2-layered structure in which a polysilicon wiring layer 131 and a metal wiring layer 132 containing aluminum are sequentially stacked (FIGS. 15, 16).

The polysilicon wiring layer 131 is provided on the front surface of the semiconductor substrate 110, via a $SiO_2$ field oxide film 130 and surrounds a periphery of the active region 121 in a substantially rectangular shape. The polysilicon wiring layer 131 is covered by an interlayer insulating film 109 containing boron phosphorus silicon glass (BPSG) or phosphorus silicon glass (PSG). In the interlayer insulating film 109, a contact hole 109a that exposes the periphery of the active region 121 from the polysilicon wiring layer 131 in a substantially rectangular shape is provided. The metal wiring layer 132 is provided in a substantially rectangular shape in contact with the polysilicon wiring layer 131 along an entire circumference thereof, in the contact hole 109a of the interlayer insulating film 109.

The first gate wiring layer 133 is connected directly to the gate pad 112 or is electrically connected to the gate pad 112 via a gate resistor 135. The second gate wiring layer 134 is coupled to the polysilicon wiring layer 131. Gate electrodes (not depicted) of the IGBT unit cells are electrically connected to the first and the second gate wiring layers 133, 134 and via the first and the second gate wiring layers 133, 134 or via the first and the second gate wiring layers 133, 134 and the gate resistor 135, are supplied with gate voltage from the gate pad 112 and fixed at a gate potential.

As a conventional semiconductor device, a device has been proposed in which in an active region, between a polysilicon wiring layer on gate electrodes and the gate electrodes, a high-resistance layer having a resistance higher than that of polysilicon, which is a material of the gate electrodes is provided (for example, refer to Japanese Laid-Open Patent Publication No. 2018-157043). In Japanese Laid-Open Patent Publication No. 2018-157043, configuration is such that gate resistors are individually connected to unit cells by the high-resistance layer between the gate wiring layer and the gate electrodes, whereby gate voltage oscillation, imbalance of the gate voltage between connected unit cells in the same gate wiring layer, etc. may be suppressed.

Further, as another conventional semiconductor device, a device has been proposed in which two layers of a gate wiring layer containing a conductive material such as aluminum are stacked on a polysilicon layer that is of the gate potential and disposed so as to surround a periphery of an active region (for example, refer to Japanese Laid-Open Patent Publication No. 2012-134198). In Japanese Laid-Open Patent Publication No. 2012-134198, the lower gate wiring layer has a width necessary for transmitting a predetermined gate signal, a width of the upper gate wiring layer is wider than the width of the lower gate wiring layer, and gate resistance values are adjusted, whereby an area of the IGBT unit cells (surface area of the active region) is increased and operation variation is suppressed.

SUMMARY OF THE INVENTION

According to an embodiment of the invention, a semiconductor device includes a semiconductor substrate having a main surface and an active region; a plurality of unit cells provided in the active region of a semiconductor substrate, each having a respective one of a plurality of insulated gates, formed by a metal, an oxide film, and a semiconductor; and a gate wiring layer to which the insulated gates of all of the unit cells are electrically connected, the gate wiring layer being provided on the main surface of the semiconductor substrate via an insulating layer, surrounding a periphery of the active region. The gate wiring layer is a multilayered structure including a first conductive layer having a first resistance value, a second conductive layer having a second resistance value that differs from the first resistance value, and an interlayer insulating film provided between the first and second conductive layers, the interlayer insulating film having one or more contact holes each of which is disposed at a predetermined position of the gate wiring layer. The first and second conductive layers face each other in a depth direction and are in electrical contact with each other via the one or more contact holes. A resistance value of the gate wiring layer is relatively low at a first area where the one or more contact holes are disposed and relatively high at a second area other than the first area.

Objects, features, and advantages of the present invention are specifically set forth in or will become apparent from the following detailed description of the invention when read in conjunction with the accompanying drawings.

DETAILED DESCRIPTION OF THE INVENTION

Figure 14:
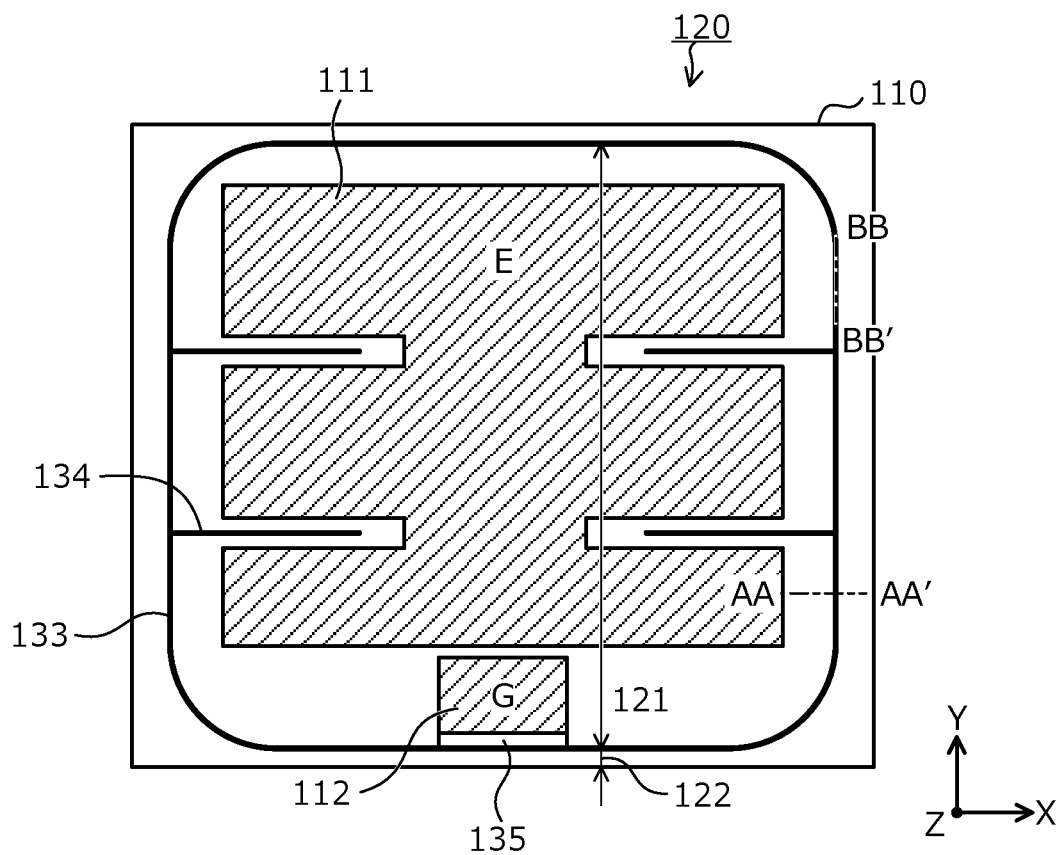
FIG. 14 is a plan view depicting a state when a conventional semiconductor device is viewed from a front surface of a semiconductor substrate thereof.
Figure 15:
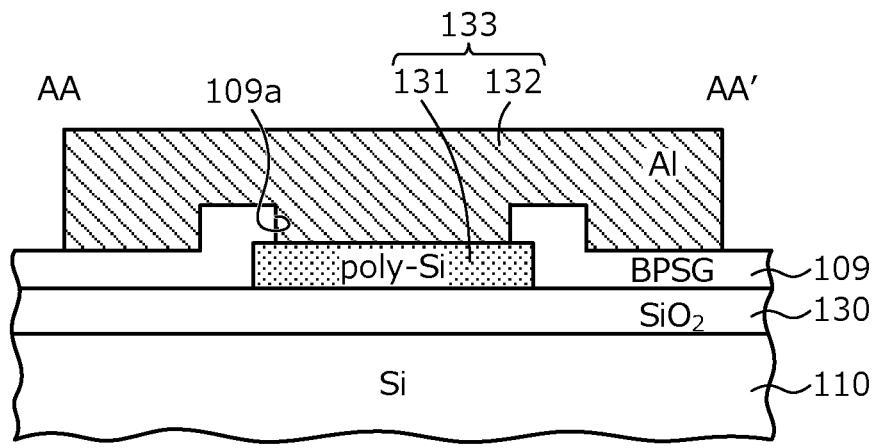
FIG. 15 is a cross-sectional view of a structure of a gate wiring layer in FIG. 14.
Figure 16:
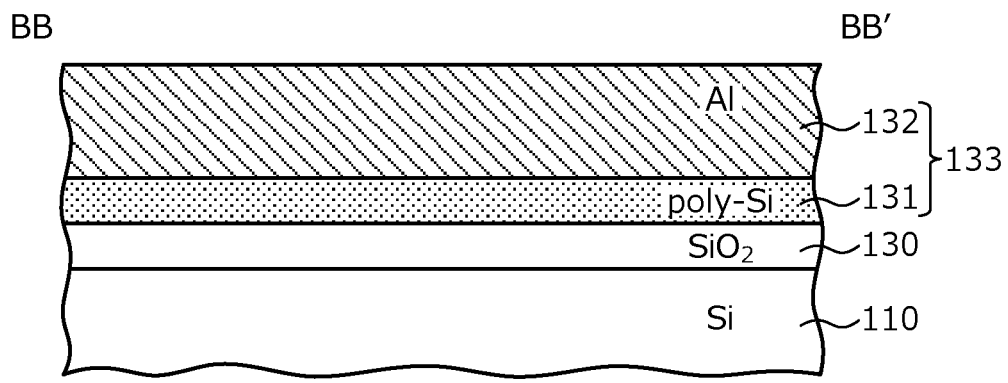
FIG. 16 is a cross-sectional view of the structure of the gate wiring layer in FIG. 14.

First, problems associated with the convention techniques are discussed. In the conventional semiconductor device 120 (refer to FIGS. 14 to 16), in an instance in which chip area (surface area of the semiconductor substrate 110) is increased, or an instance in which on a wiring board (not depicted), a lead frame (not depicted) and the gate pad 112 are connected, an instance of a reverse conducting IGBT (RC-IGBT), or an instance in which switching speed is to be increased, differences in gate potential between the unit cells connected in parallel occur and an imbalance of energizing current at a surface of the semiconductor substrate 110 occurs (biased flow). As a result, a temperature of the semiconductor substrate 110 increases locally, whereby destruction or reduced breakdown tolerance may occur.

Embodiments of a semiconductor device according to the present invention will be described in detail with reference to the accompanying drawings. In the present description and accompanying drawings, layers and regions prefixed with n or p mean that majority carriers are electrons or holes. Additionally, + or − appended to n or p means that the impurity concentration is higher or lower, respectively, than layers and regions without + or −. In the description of the embodiments below and the accompanying drawings, main portions that are identical will be given the same reference numerals and will not be repeatedly described.

Figure 1:
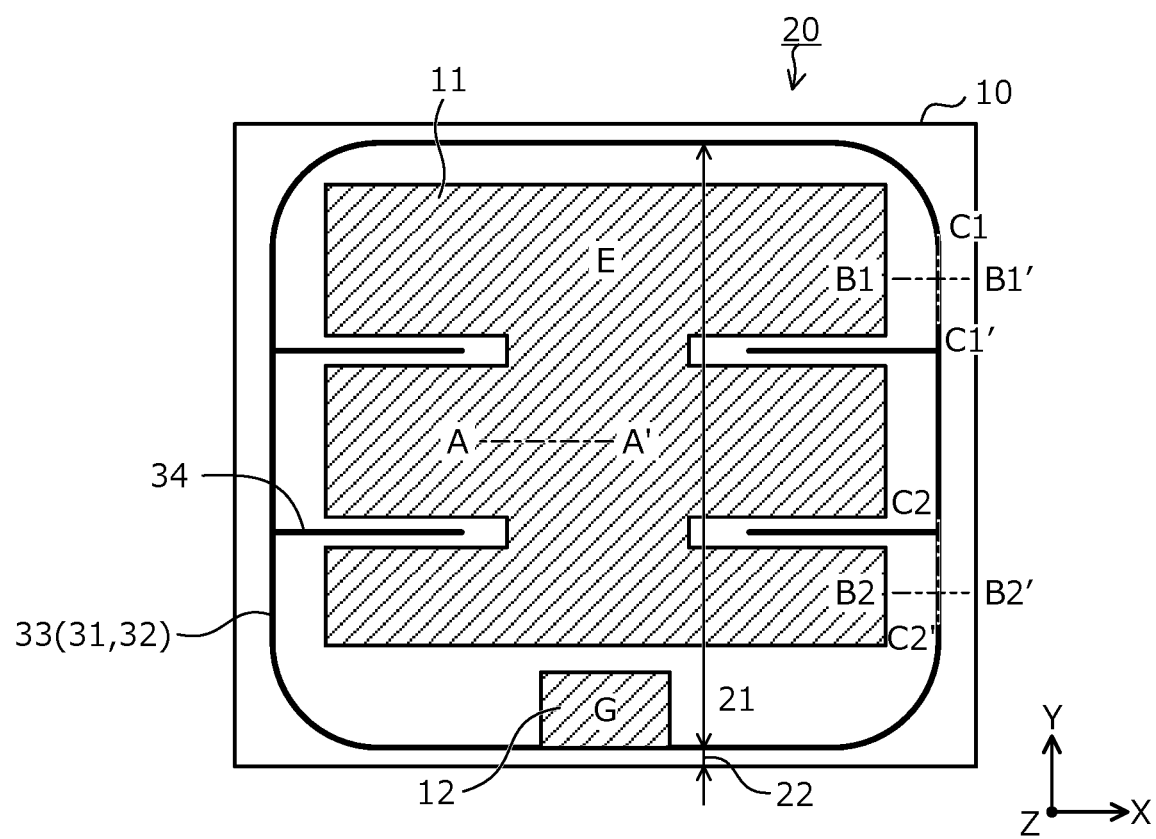
FIG. 1 is a plan view of a state when a semiconductor device according to a first embodiment is viewed from a front surface of a semiconductor substrate.
Figure 2:
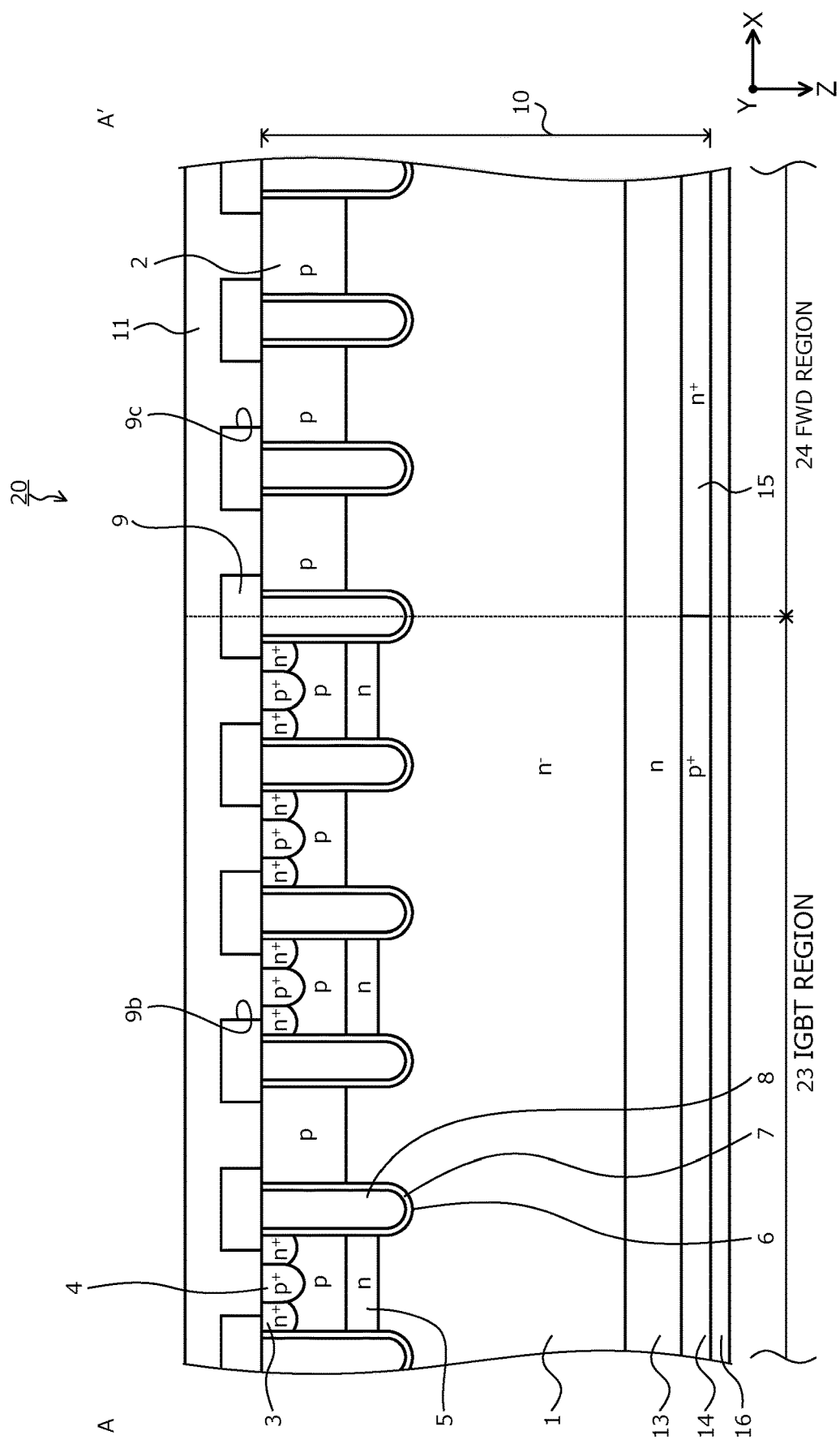
FIG. 2 is a cross-sectional view of a structure along cutting line A-A' in FIG. 1.

A structure of a semiconductor device according to a first embodiment is described taking, as an example, a RC-IGBT having an IGBT and a freewheeling diode (FWD) connected in antiparallel to the IGBT, incorporated on a single semiconductor substrate (semiconductor chip). FIG. 1 is a plan view of a state when the semiconductor device according to the first embodiment is viewed from a front surface of the semiconductor substrate. FIG. 2 is a cross-sectional view of the structure along cutting line A-A' in FIG. 1.

Figure 3:
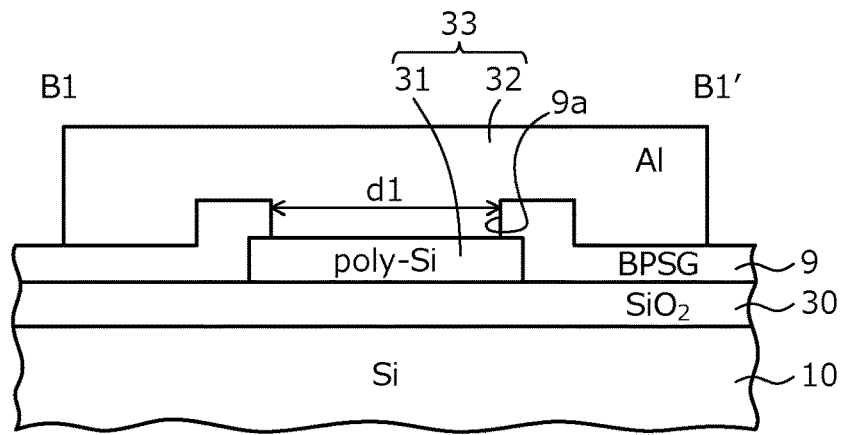
FIG. 3 is a cross-sectional view of a structure of a gate wiring layer in FIG. 1.
Figure 4:
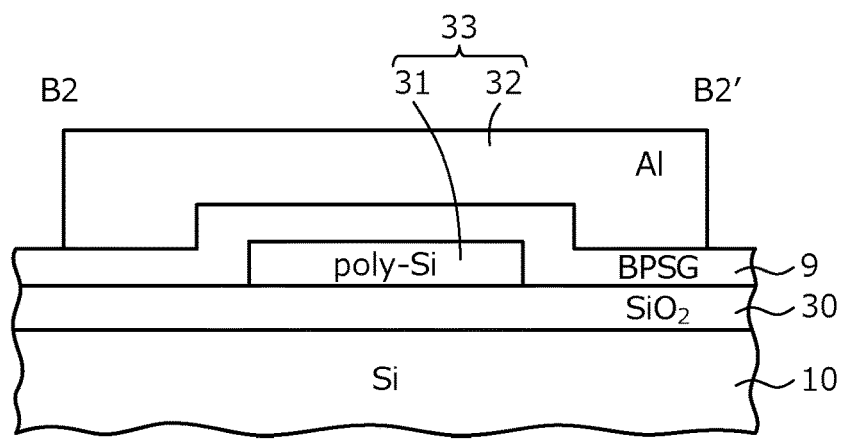
FIG. 4 is a cross-sectional view of the structure of the gate wiring layer in FIG. 1.
Figure 5:
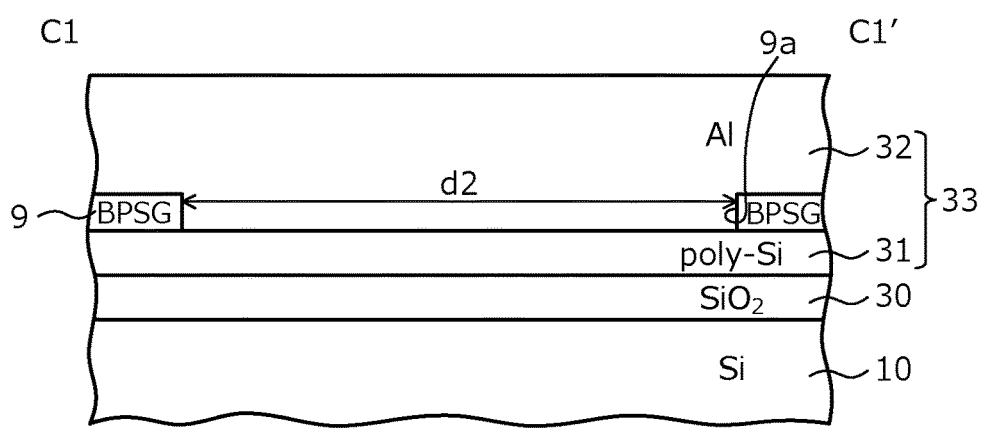
FIG. 5 is a cross-sectional view of the structure of the gate wiring layer in FIG. 1.
Figure 6:
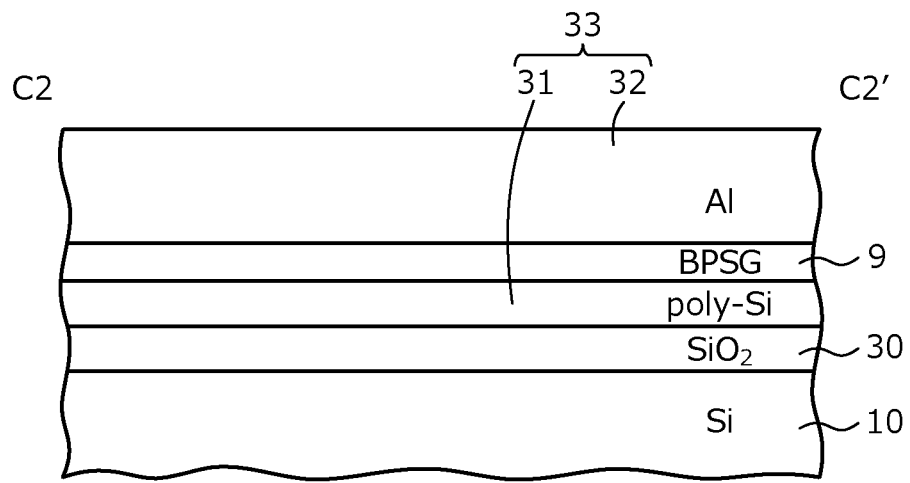
FIG. 6 is a cross-sectional view of the structure of the gate wiring layer in FIG. 1.

FIGS. 3, 4, 5, and 6 are cross-sectional views of a structure of a gate wiring layer in FIG. 1. FIGS. 3 and 4 respective depict cross-sections of the structure along cutting line B1-B1' and cutting line B2-B2' that are parallel to a direction (in FIG. 1, the first direction X) orthogonal to a first gate wiring layer 33. FIGS. 5 and 6 each depict a cross-section of the structure along cutting line C1-C1' and cutting line C2-C2' that are parallel to a circumferential direction (in FIG. 1, the second direction Y) in which the first gate wiring layer 33 extends parallel to a front surface of a semiconductor substrate 10.

The direction orthogonal to the first gate wiring layer 33 is a direction of a normal to a substantially rectangular shaped border between an active region 21 and an edge voltage withstanding structure region 22 (latitude direction of the first gate wiring layer 33) when viewed from a front side of the semiconductor substrate 10. The circumferential direction in which the first gate wiring layer 33 extends is a circumferential direction (circumferential direction (longitudinal direction) of the first gate wiring layer 33) along the substantially rectangular-shaped border between the active region 21 and the edge voltage withstanding structure region 22 when viewed from the front side of the semiconductor substrate 10.

A semiconductor device 20 according to the first embodiment depicted in FIG. 1 is a RC-IGBT in which in the active region 21 of the semiconductor substrate (semiconductor chip) 10, an IGBT region (first device element region) 23 that is an operating region of the IGBT and a FWD region (second device element region) 24 that is an operating region of the FWD are provided adjacent to each other (refer to FIGS. 2 and 12), and the semiconductor device 20 includes on the front surface of the semiconductor substrate 10, an emitter pad 11, a gate pad 12, and the first and the second gate wiring layers 33, 34.

The active region 21 is a region through which current flows during an ON state and, for example, is disposed in substantially a center of the semiconductor substrate 10. The active region 21, for example, has a substantially rectangular shape in a plan view. Between the active region 21 and an end of the semiconductor substrate 10 (chip end) is the edge voltage withstanding structure region 22. The edge voltage withstanding structure region 22 is adjacent to the active region 21 and surrounds a periphery of the active region 21. The edge voltage withstanding structure region 22 has a function of mitigating electric field of the front side of the semiconductor substrate 10 and sustaining withstand voltage.

In the edge voltage withstanding structure region 22, a voltage withstanding structure such as a guard ring, a field limiting ring (FLR), a junction termination extension (JTE) structure, or a field plate (FP) is disposed. The withstand voltage is a maximum voltage at which no erroneous operation or dielectric breakdown of a device element (unit cells of the RC-IGBT) occurs.

In the IGBT region 23, multiple unit cells of the IGBT configuring the RC-IGBT are disposed in parallel. The unit cells of the IGBT of the IGBT region 23 are connected to one another in parallel. In the FWD region 24, multiple unit cells of the FWD configuring the RC-IGBT are disposed in parallel. The unit cells of the FWD of the FWD region 24 are connected in parallel to one another. The IGBT of the IGBT region 23 and the FWD of the FWD region 24 are connected to each other in antiparallel.

The IGBT region 23 and the FWD region 24 face the emitter pad 11 in a depth direction Z and do not face the second gate wiring layer 34 (gate fingers) in the depth direction Z. The IGBT region 23 and the FWD region 24, for example, have substantially rectangular shapes in a plan view. The IGBT region 23 and the FWD region 24, for example, are disposed in plural adjacent to each other, repeatedly alternating one another and sharing a side of the substantially rectangular shape thereof in a direction parallel to the front surface of the semiconductor substrate 10 (refer to FIG. 12).

The emitter pad 11, the gate pad 12, and the second gate wiring layer 34 are disposed in the active region 21, separate from one another. The emitter pad 11 and the gate pad 12 are metal layers containing a highly conductive material such as aluminum (Al). The emitter pad 11, for example has, in a plan view, a substantially rectangular shape having recesses (recessed inward toward the center of the semiconductor substrate 10) at portions where the second gate wiring layer 34 is disposed, the emitter pad 11 covers substantially an entire area of the active region 21.

The gate pad 12, for example, has a substantially rectangular shape in a plan view and, for example, is disposed near the border between the active region 21 and the edge voltage withstanding structure region 22. The second gate wiring layer 34 is a single-layer polysilicon wiring layer at a same level as a later-described polysilicon (poly-Si) wiring layer (conductive layer) 31 of the first gate wiring layer 33 (gate runner), is connected to the polysilicon wiring layer 31, and is electrically connected to the gate pad 12 via the first gate wiring layer 33.

The second gate wiring layer 34 is a single-layer polysilicon wiring layer, whereby the second gate wiring layer 34 is disposed beneath the emitter pad 11 and the gate pad 12 via an interlayer insulating film 9 containing boron phosphorus silicon glass (BPSG) or phosphorus silicon glass (PSG) (refer to FIG. 2)), and is electrically insulated from the emitter pad 11 via the interlayer insulating film 9. Therefore, short-circuiting of the emitter pad 11 and the second gate wiring layer 34 may be prevented by a wiring terminal such as a lead frame bonded to the emitter pad 11.

The second gate wiring layer 34, for example, is connected to the polysilicon wiring layer 31 of the first gate wiring layer 33 near the border between the active region 21 and the edge voltage withstanding structure region 22; and at the place of connection, in a plan view, the second gate wiring layer 34 has a linear shape orthogonal to the first gate wiring layer 33. For example, the second gate wiring layer 34 is provided in plural (in FIG. 1, four are provided) and the second gate wiring layers 34 may be disposed in a shape of comb teeth respectively extending parallel to the front surface of the semiconductor substrate 10 and toward the center of the semiconductor substrate 10, from respectively different places near the border between the active region 21 and the edge voltage withstanding structure region 22.

The first gate wiring layer 33 is disposed in the edge voltage withstanding structure region 22 and surrounds the periphery of the active region 21 in a substantially rectangular shape. The first gate wiring layer 33 is connected directly to the gate pad 12 or, for example, is connected electrically to the gate pad 12 via a gate resistor (not depicted, corresponds to reference numeral 135 in FIG. 14). The gate resistor, for example, similar to the first gate wiring layer 33, has a 2-layered structure in which a polysilicon wiring layer and a metal wiring layer are sequentially stacked.

The first gate wiring layer 33 has a 2-layered structure in which the polysilicon wiring layer 31 and a metal wiring layer (conductive layer) 32 containing aluminum are stacked (refer to FIGS. 3 to 6). The first gate wiring layer 33 is disposed at a position separate from a bonding portion of a wiring terminal such as a lead frame bonded to the emitter pad 11. Therefore, even when the first gate wiring layer 33 has the metal wiring layer 32 at the same level as the emitter pad 11, short-circuiting thereof with the emitter pad 11 does not occur.

The polysilicon wiring layer 31 and the metal wiring layer 32 both surround the periphery of the active region 2 in a substantially rectangular shape. The polysilicon wiring layer 31 and the metal wiring layer 32 are in contact with each other at a portion of a periphery of the first gate wiring layer 33 via a contact hole 9a of the interlayer insulating film 9, and at a remaining portion of the periphery, are electrically insulated from each other by the interlayer insulating film 9 (refer to FIGS. 3 to 6). A resistance value per unit area of the first gate wiring layer 33 (resistance value of wiring resistance) is a resistance value per unit area of the polysilicon wiring layer 31 and is relatively low in portions where the polysilicon wiring layer 31 and the metal wiring layer 32 are electrically insulated from each other.

The resistance value per unit area of the first gate wiring layer 33 is relatively high in portions where the polysilicon wiring layer 31 and the metal wiring layer 32 are in contact with each other. In particular, the resistance value per unit area of the first gate wiring layer 33 in portions where the polysilicon wiring layer 31 and the metal wiring layer 32 are in contact with each other is higher than the resistance value per unit area of the polysilicon wiring layer 31 by an amount obtained by subtracting a contact resistance value per unit area for the polysilicon wiring layer 31 and the metal wiring layer 32, from a resistance value per unit area of the metal wiring layer 32.

The contact hole 9a is disposed in a portion separate from the gate pad 12, and a contact area of the polysilicon wiring layer 31 and the metal wiring layer 32 is relatively large in the portion separate from the gate pad 12. Therefore, the first gate wiring layer 33 is configured having relatively more of the metal wiring layer 32 having a resistance lower than that of the polysilicon wiring layer 31, in the portion separate from the gate pad 12. In this manner, the resistance value of the first gate wiring layer 33 is adjusted to be relatively higher at places near the gate pad 12 as compared to places separate from the gate pad 12.

In the conventional structure (refer to FIGS. 14 to 16), the polysilicon wiring layer 131 and the metal wiring layer 132 are in contact with each other along the entire periphery of the first gate wiring layer 133 and therefore, differences in gate potential occur between the IGBT unit cells connected in parallel, and an imbalance of energizing current occurs at the surface of the semiconductor substrate 110. Thus, in the first embodiment, between the multiple IGBT regions 23 and between the unit cells of a single IGBT region 23, a parasitic gate resistance value due to the first gate wiring layer 33 is adjusted so that differences in gate potential do not occur between the IGBT unit cells connected in parallel.

In particular, during turn OFF, the speed at which the IGBT gate voltage decreases to be less than the gate threshold voltage is relatively faster for unit cells near the gate pad 12 and relatively slower the further a unit cell is from the gate pad 12. Further, during turn OFF, the speed at which the IGBT gate voltage decreases to be less than the gate threshold voltage is relatively fast for unit cells near the first gate wiring layer 33 and relatively slower the further a unit cell is from the first gate wiring layer 33.

At the unit cells for which turn OFF (cut off) is slower, dV/dt (change in collector-emitter voltage in a short time) increases and cut-off current continues to flow. Therefore, cut-off current concentrates in unit cells for which turn OFF is slower and the current density increases. Cut-off current is positive hole current that flows when positive holes accumulated in the semiconductor substrate 10 are pulled out to the emitter pad 11 during turn OFF of the IGBT.

Thus, in the present embodiment, the resistance value of the first gate wiring layer 33 is adjusted at portions so that the gate voltages of all of the unit cells of the IGBT are made substantially uniform and all of the unit cells of the IGBT turn OFF at substantially a same timing. Voltages being substantially uniform means that voltage waveforms of the gate voltages of all of the unit cells of the IGBT are the same within a range including a predetermined allowed error, with respect to elapsed time (voltage application time).

For example, in the RC-IGBT chip (the semiconductor substrate 10) in which the lead frame is bonded to the emitter pad 11, the inventors confirmed that heat stress (heat load) is highest near the center of the semiconductor substrate 10, and dV/dt is highest during turn OFF of the IGBT. When there are vulnerable portions such as crystal defects in portions of the semiconductor substrate 10 with high heat stress or high dV/dt, current density in the vulnerable portions increases and destruction easily occurs due to differences in heat stress and differences in current density.

Therefore, the polysilicon wiring layer 31 and the metal wiring layer 32 are partially electrically insulated from each other so that the current density at the surface of the semiconductor substrate 10 during turn OFF of the IGBT becomes uniform and the resistance value of the first gate wiring layer 33 is increased at the insulated portions. As a result, between the multiple IGBT regions 23 and between the unit cells of a single IGBT region 23, the parasitic gate resistance value due to the first gate wiring layer 33 may be partially adjusted and differences in gate potential between the unit cells connected in parallel may be reduced.

For example, at the surface of the semiconductor substrate 10, portions where heat stress is relatively high, portions where electrical stress (electrical load) such as current density and dV/dt during turn OFF of the IGBT is large, etc. are assumed. The resistance value of the first gate wiring layer 33 suffices to be partially adjusted so that theses stresses become uniform at the surface of the semiconductor substrate 10. At this time, the resistance value of the first gate wiring layer 33 may be adjusted with consideration of the chip area (surface area of the semiconductor substrate 10), the area (surface area) of the active region 21, the area and the arrangement of the IGBT region 23, etc.

In particular, for example, the semiconductor substrate 10 is destroyed in portions where resistance to destruction is lowest due to a combination of various factors such as dynamic characteristics (switching loss, reverse bias safe operating area (RBSOA), turn OFF withstand capability) of the semiconductor device 20, manufacturing variation of the semiconductor device 20, etc. Therefore, in the semiconductor substrate 10, by confirming portions that are destroyed under the same design conditions, portions where the polysilicon wiring layer 31 and the metal wiring layer 32 are to be electrically insulated from each other may be determined so that dV/dt and current density does not become large in these portions.

Next, a cross-section of the structure of the semiconductor device 20 according to the first embodiment is described. As depicted in FIG. 2, in the active region 21 (refer to FIG. 1), in the semiconductor substrate 10, the IGBT region 23 and the FWD region 24 are disposed adjacent to one another. In FIG. 2, a vicinity of one border between the IGBT region 23 and the FWD region 24 that are adjacent to one another is depicted. In the semiconductor substrate 10, an n$^-$-type drift region 1 is provided. The n$^-$-type drift region 1 reaches from the active region 21 to the end of the semiconductor substrate 10 in a direction parallel to the front surface of the semiconductor substrate 10.

Between the front surface of the semiconductor substrate 10 and the n$^-$-type drift region 1, a p-type base region 2 is provided. The p-type base region 2 is provided in an entire area of the active region 21, spanning the IGBT region 23 and the FWD region 24. The p-type base region 2, in the FWD region 24, functions as a p-type anode region. In the IGBT region 23, between the front surface of the semiconductor substrate 10 and the p-type base region 2, n$^+$-type emitter regions 3 and p$^+$-type contact regions 4 are each selectively provided. The p$^+$-type contact regions 4 may be omitted.

In the IGBT region 23, between the n$^-$-type drift region 1 and the p-type base region 2, an n-type accumulation layer 5 may be provided. The n-type accumulation layer 5 is disposed between later-described trenches 6 that are adjacent to one another. The n-type accumulation layer 5 becomes a barrier of minority carriers (holes) of the n$^-$-type drift region 1 when the IGBT turns ON and has a function of accumulating minority carriers in the n$^-$-type drift region 1. In an entire area of the active region 21, the trenches 6 are provided in a striped pattern extending in a direction parallel to the front surface of the semiconductor substrate 10.

Ends of the trenches 6 terminate at positions facing the first gate wiring layer 33 (refer to FIGS. 3 to 6) or the second gate wiring layer 34 (refer to FIG. 1) in the depth direction Z. A quantity (total number) of the trenches 6 present is a sum of an IGBT cell quantity of the IGBT region 23 and a FWD cell quantity of the FWD region 24. The trenches 6, in the IGBT region 23, penetrate through the $n^+$-type emitter regions 3 and the p-type base region 2, and reach the $n^-$-type drift region 1. The trenches 6, in the FWD region 24, penetrate through the p-type base region 2 and reach the $n^-$-type drift region 1.

Figure 13:
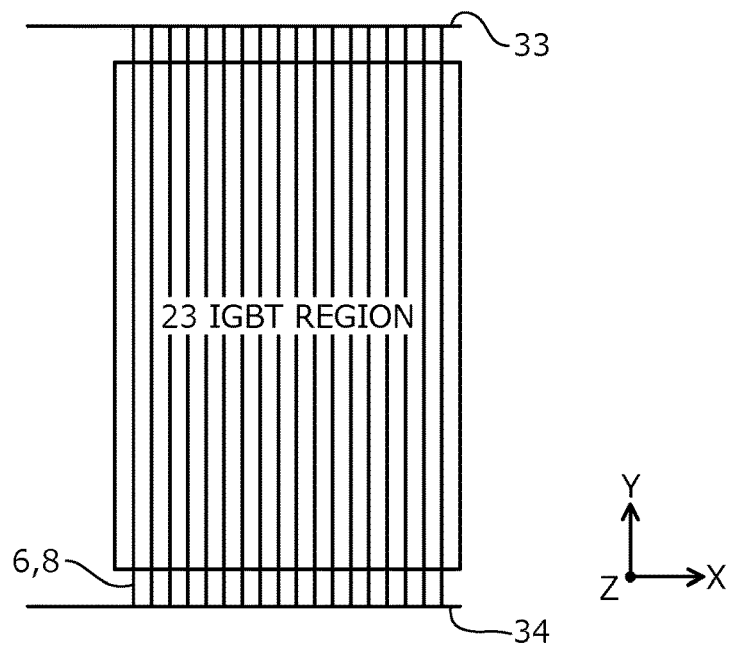
FIG. 13 is an enlarged view of a portion of FIG. 12.

The trenches 6 and the second gate wiring layer 34, in the active region 21, for example, are disposed orthogonal to each other as viewed from the front side of the semiconductor substrate 10 (refer to FIG. 13). Therefore, the trenches 6, at portions thereof other than the ends thereof, may face the second gate wiring layer 34 in the depth direction Z. In the trenches 6, gate electrodes 8 containing polysilicon are respectively provided via respective insulating films 7. In the trenches 6, the gate electrodes 8 extend in a linear shape in a longitudinal direction (in FIG. 2, the second direction Y) in which the trenches 6 extend in a linear shape.

The gate electrodes 8, at portions thereof where the respective trenches 6 face the first gate wiring layer 33 or the second gate wiring layer 34 in the depth direction Z, are in contact with the first gate wiring layer 33 or the second gate wiring layer 34 the depth direction Z. All of the gate electrodes 8, via the first gate wiring layer 33 or via both the first and the second gate wiring layers 33, 34, are electrically connected to the gate pad 12 (refer to FIG. 1). The gate electrodes 8, via the first and the second gate wiring layers 33, 34, supply gate voltage from the gate pad 12 and are fixed at the gate potential.

In the IGBT region 23, unit cells of the IGBT of the IGBT region 23 have MOS gates (insulated gates having a metal, oxide film, and semiconductor) having a trench gate structure configured by the p-type base region 2, the $n^+$-type emitter regions 3, and the $p^+$-type contact regions 4 between the trenches 6 that are adjacent to one another, and the insulating films 7 and the gate electrodes 8 in the respective trenches 6. In the FWD region 24, unit cells of the FWD of the FWD region 24 have the p-type anode region configured by the p-type base region 2 between the trenches 6 that are adjacent to one another.

In the edge voltage withstanding structure region 22, in the semiconductor substrate 10, a voltage withstanding structure such as a guard ring, FLR, etc. is provided further outward (closer to the end of the semiconductor substrate 10) than is the first gate wiring layer 33 that forms the gate runner. For example, as the voltage withstanding structure, a p-type region configuring a FLR or a guard ring (not depicted), or an n-type or a p-type stopper region (not depicted) exposed at the end (side surface) of the semiconductor substrate 10 may be selectively provided further outward than is the first gate wiring layer 33, between the front surface of the semiconductor substrate 10 and the $n^-$-type drift region 1.

On the front surface of the semiconductor substrate 10, in the active region 21, the second gate wiring layer 34 that forms the gate fingers is provided via a field oxide film (insulating layer) 30 (refer to FIGS. 3 to 6). The field oxide film 30, in the edge voltage withstanding structure region 22, covers an entire area of the front surface of the semiconductor substrate 10, and in the active region 21, extends between the front surface of the semiconductor substrate 10 and the second gate wiring layer 34. Further, in the edge voltage withstanding structure region 22, the polysilicon wiring layer 31 is provided on the front surface of the semiconductor substrate 10 via the field oxide film 30.

The polysilicon wiring layer 31 configures the first gate wiring layer 33. Near an inner periphery of the field oxide film 30 (not depicted), the gate electrodes 8 are in contact with the polysilicon wiring layer 31 or the second gate wiring layer 34 in the depth direction Z. In a plan view, a shape of the inner periphery of the field oxide film 30 (in a plan view, a shape of an opening exposing the active region 21) is a same shape as that of the emitter pad 11 in a plan view. The gate electrodes 8, the polysilicon wiring layer 31, or the second gate wiring layer 34 may be formed concurrently, partially removing one layer of a polysilicon layer.

The interlayer insulating film 9 containing BPSG is provided in an entire area of the front surface of the semiconductor substrate 10 and covers the gate electrodes 8, the second gate wiring layer 34, and the polysilicon wiring layer 31. In the depth direction Z, the contact hole 9a and contact holes 9b and 9c that penetrate through the interlayer insulating film 9 are provided. The contact holes 9b, in the IGBT region 23, expose the $n^+$-type emitter regions 3 and the $p^+$-type contact regions 4 between the trenches 6 that are adjacent to one another. In an instance in which the $p^+$-type contact regions 4 are omitted, in the contact holes 9b, the p-type base region 2 is exposed instead of the $p^+$-type contact regions 4.

The contact holes 9c, in the FWD region 24, expose the p-type base region 2. The contact hole 9a, in the edge voltage withstanding structure region 22, partially exposes the polysilicon wiring layer 31. At least one contact hole 9a is provided at a predetermined position. In an instance in which the contact hole 9a is provided in plural, a width in a direction of the normal to the border between the active region 21 and the edge voltage withstanding structure region 22 and a width in the circumferential direction (hereinafter, opening width and opening length, respectively) d1, d2 may be the same for all of the contact holes 9a or may be changed for each the contact hole 9a.

In an instance in which the opening width d1 and the opening length d2 are changed for each the contact hole 9a, in a portion where the resistance value of the first gate wiring layer 33 is to be partially reduced, whether the opening width d1 of the contact hole 9a is made relatively widen or the opening length d2 is made relatively lengthen, it suffices that both are satisfied. In a portion where the resistance value of the first gate wiring layer 33 is to be partially increased, whether the opening width d1 of the contact hole 9a is made relatively narrow or the opening length d2 is made relatively short, it suffices that both are satisfied.

The contact hole 9a is disposed in a predetermined place and as described hereinafter, in the contact hole 9a, the polysilicon wiring layer 31 and the metal wiring layer 32 are electrically connected and at other places, the polysilicon wiring layer 31 and the metal wiring layer 32 are electrically insulated from each other. In this manner, portions where the polysilicon wiring layer 31 and the metal wiring layer 32 are electrically insulated from each other are formed, the resistance value of the first gate wiring layer 33 is adjusted at portions thereof and as described above, between the IGBT regions 23 and between the unit cells of a single IGBT region 23, the parasitic gate resistance value due to the first gate wiring layer 33 is adjusted.

The emitter pad 11, in the active region 21, is provided on the interlayer insulating film 9 so as to be embedded in the contact holes 9b, 9c. The emitter pad 11 is electrically connected to the p-type base region 2, the $n^+$-type emitter regions 3, and the $p^+$-type contact regions 4 in the contact holes 9b of the IGBT region 23, and functions as an emitter electrode. The emitter pad 11, in the contact holes 9c of the FWD region 24, are electrically connected to the p-type base region 2 and function as an anode electrode.

The gate pad 12 (refer to FIG. 1), in the active region 21, is provided on the interlayer insulating film 9, separate from the emitter pad 11. All of the gate electrodes 8 are electrically connected to the gate pad 12 via the first and the second gate wiring layers 33, 34. Surfaces of the emitter pad 11 and the gate pad 12 are respectively covered by plating films containing, for example, nickel having high adhesiveness with solder. Wiring terminals such as lead frames (not depicted) are respectively connected to the emitter pad 11 and the gate pad 12.

The metal wiring layer 32 configuring the first gate wiring layer 33, at a position facing the polysilicon wiring layer 31 in the depth direction Z, is provided on the interlayer insulating film 9 so as to be embedded in the contact hole 9a. The metal wiring layer 32, in the contact hole 9a, at portion of the periphery thereof is in contact with the polysilicon wiring layer 31 (FIG. 3,5) and a remaining portion of the periphery thereof is electrically insulated from the polysilicon wiring layer 31 by the interlayer insulating film 9 (FIGS. 4, 6). As described above, at portions where the polysilicon wiring layer 31 and the metal wiring layer 32 are electrically insulated from each other, the resistance value of the first gate wiring layer 33 is relatively high.

Between a back surface of the semiconductor substrate 10 and the n$^-$-type drift region 1, an n-type field stop (FS) layer 13, a p$^+$-type collector region 14, and an n$^+$-type cathode region 15 are each provided. The n-type field stop layer 13 is provided spanning an entire area of the active region 21. Between the back surface of the semiconductor substrate 10 and the n-type field stop layer 13, the p$^+$-type collector region 14 and the n$^+$-type cathode region 15 are provided adjacent to each other in a direction in which the IGBT region 23 and the FWD region 24 are arranged (in FIG. 2, the first direction X).

In each of the multiple IGBT regions 23, the p$^+$-type collector region 14 is provided spanning an entire area of the IGBT region 23. In each of the multiple FWD regions 24, the n$^+$-type cathode region 15 is provided spanning an entire area of the FWD region 24. In an entire area of the back surface of the semiconductor substrate 10, a back electrode 16 is provided. The back electrode 16 is electrically connected to the p$^+$-type collector region 14 and functions as a collector electrode; and is electrically connected to the n$^+$-type cathode region 15 and functions as a cathode electrode.

As described above, according to the first embodiment, between the multiple IGBT regions and between the unit cells in a single IGBT region, the parasitic gate resistance value due to the first gate wiring layer is adjusted so that the lower polysilicon wiring layer and the upper metal wiring layer configuring the first gate wiring layer are partially insulated and no gate potential difference occurs between the IGBT unit cells connected in parallel. As a result, the IGBT gate voltage during turn OFF is substantially uniform, and all of the IGBT unit cells may be turned OFF in a state in which the gate voltage is reduced to about the gate threshold voltage.

During turn OFF of the IGBT, in a state in which the gate voltage is reduced to about the gate threshold voltage, none of the unit cells of the IGBT is in an ON state and therefore, an imbalance of energizing current at the surface of the semiconductor chip (semiconductor substrate) is suppressed and the current density at the surface of the semiconductor chip may be made uniform. As a result, in parts of the semiconductor substrate easily destroyed during turn OFF of the IGBT, increase of the density current may be suppressed and therefore, dynamic characteristics (switching loss, RBSOA, turn OFF withstand capability, etc.) of the semiconductor device may be enhanced.

Further, according to the first embodiment, contact holes are disposed at predetermined places in the interlayer insulating film between the polysilicon wiring layer and the first gate wiring layer configuring the metal wiring layer, whereby the polysilicon wiring layer and the metal wiring layer may be partially insulated from each other. Therefore, on the semiconductor substrate, disposal of additional components, additional configuration, etc. for preventing differences in gate potential between the IGBT unit cells connected in parallel is unnecessary, size increases of the semiconductor device may be prevented, and easy application to an existing semiconductor device is possible without increases in cost.

Further, in general, when a semiconductor chip incorporated into a module fails, loss costs increase by the number of other parts incorporated in the module and therefore, before incorporation into a module, a reliability evaluation test that evaluates electrical characteristics of the semiconductor device is performed for the semiconductor chips separately. In the reliability evaluation test, a probe needle is thin and the contact area thereof with the electrode pad of the semiconductor chip is small. Therefore, current flows in the semiconductor chip in a direction parallel to the main surfaces of the semiconductor chip (horizontal direction), from the contact area between the probe needle and the electrode pad, and the current density at the surface of the semiconductor chip is not uniform.

When a vulnerable part of the semiconductor chip is apart from a contact point between the probe needle and the electrode pad, the current that flows in the vulnerable part is reduced by a resistance component of the electrode pad and the electrical characteristics of the vulnerable part is evaluated under electrical stress smaller than measurement conditions. In the semiconductor chip to which a lead frame is bonded after incorporation to the module, current flows non-uniformly at the surface of the semiconductor chip, in a direction orthogonal to the main surfaces of the semiconductor chip (vertical direction) and therefore, the current that flows in the vulnerable part of the semiconductor chip may be larger than that at the time of the reliability evaluation test and destruction may occur in the vulnerable part.

On the other hand, according to the first embodiment, as described above, at the surface of the semiconductor chip, imbalance of the energizing current may be suppressed and therefore, during the reliability evaluation test, even when voltage is applied from the probe needle having a small contact area with the electrode pad, the current density at the surface of the semiconductor chip may be made substantially uniform. Therefore, a defect of the semiconductor chip may be detected by the reliability evaluation test and failure of the semiconductor chip after incorporation into the module may be suppressed, thereby enabling suppression of increases in module cost and decreases in yield.

Further, in the conventional structure, in an instance in which the thickness of the n$^-$-type drift region is a typical thickness corresponding to the withstand voltage, when resistivity of the n$^-$-type drift region is increased, the withstand voltage increases; however, the electric field strength in the semiconductor chip increases, whereby avalanche tolerance decreases. Further, when the resistivity of the n$^-$-type drift region is increased and the thickness of the n⁻-type drift region increased, while imbalance of the energizing current may be suppressed at the surface of the semiconductor chip, electrical characteristics of the semiconductor device may degrade, and the semiconductor device may not satisfy necessary specifications.

On the other hand, according to the first embodiment, even in an instance in which the semiconductor device satisfies necessary specifications (the resistivity of the n⁻-type drift region is low and the thickness of the n⁻-type drift region is thin), imbalance of energizing current may be suppressed at the surfaces of the semiconductor chip. For example, in an instance of a RC-IGBT having a withstand voltage of 1200V and a thickness of about 120 μm for the n⁻-type drift region, when the resistivity of the n⁻-type drift region is 65 Ω·cm, a semiconductor chip appears that exceeds the RBSOA on an order of a few percent; however, when the resistivity of the n⁻-type drift region is 57Ω, a semiconductor chip that exceeds the RBSOA almost never appears. For example, when the resistivity of the n⁻-type drift region is at most about 60Ω, decrease of the product passing rate is prevented and semiconductor chip destruction after product shipment is suppressed.

Figure 7:
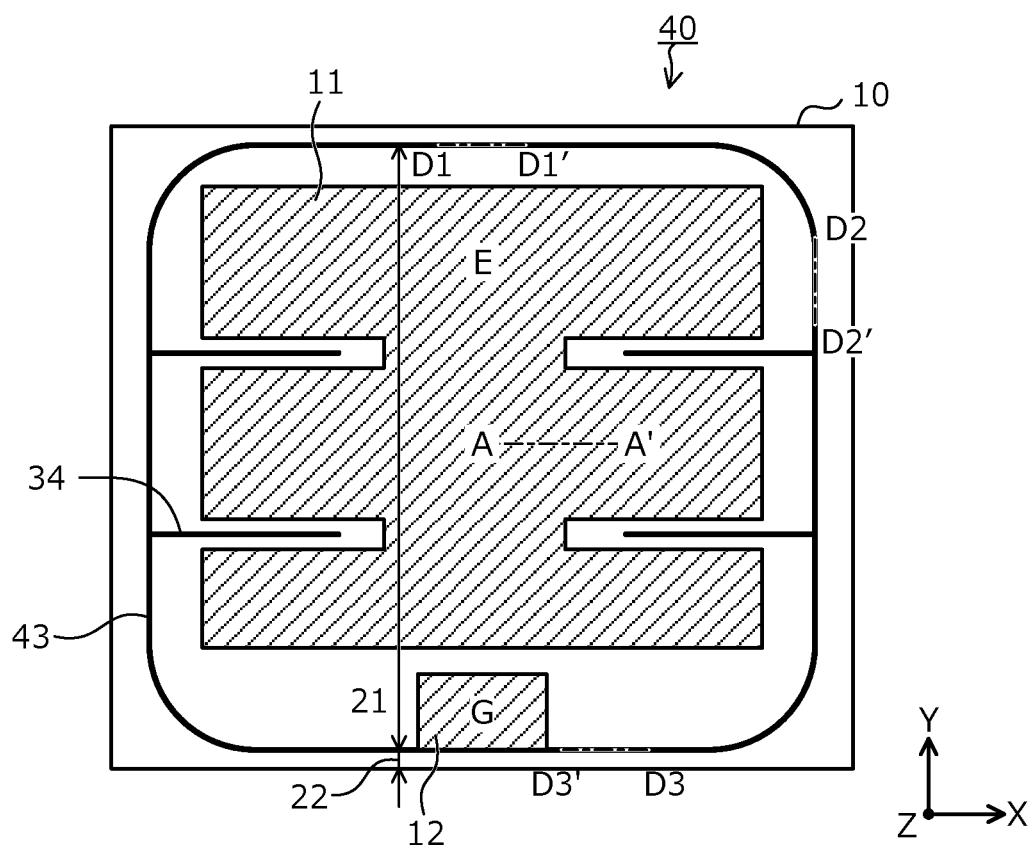
FIG. 7 is a plan view of a state when a semiconductor device according to a second embodiment is viewed from the front side of the semiconductor substrate.
Figure 8:
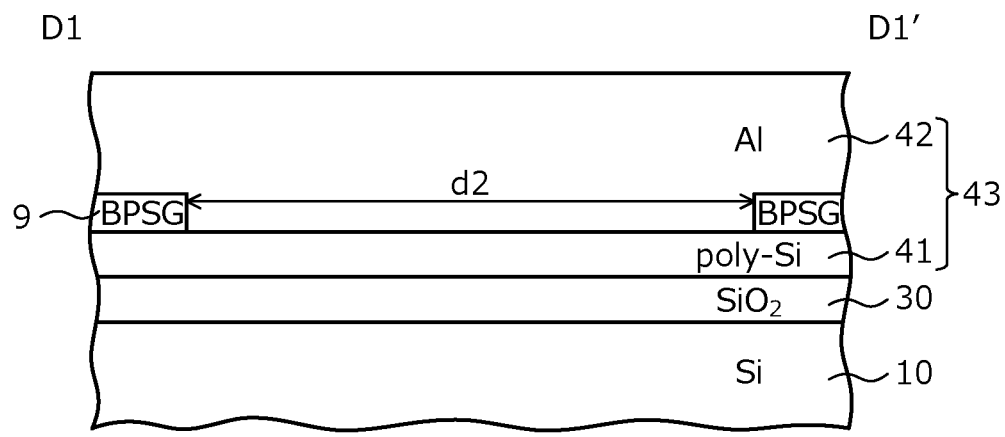
FIG. 8 is a cross-sectional view of the gate wiring layer in FIG. 7.
Figure 9:
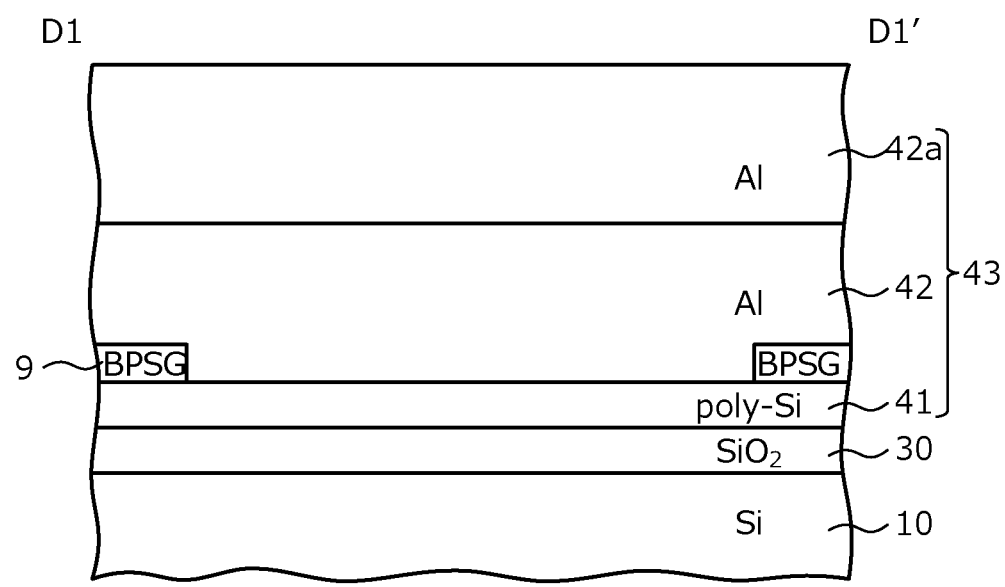
FIG. 9 is a cross-sectional view depicting another example of the structure along cutting line D1-D1' in along FIG. 7.
Figure 10:
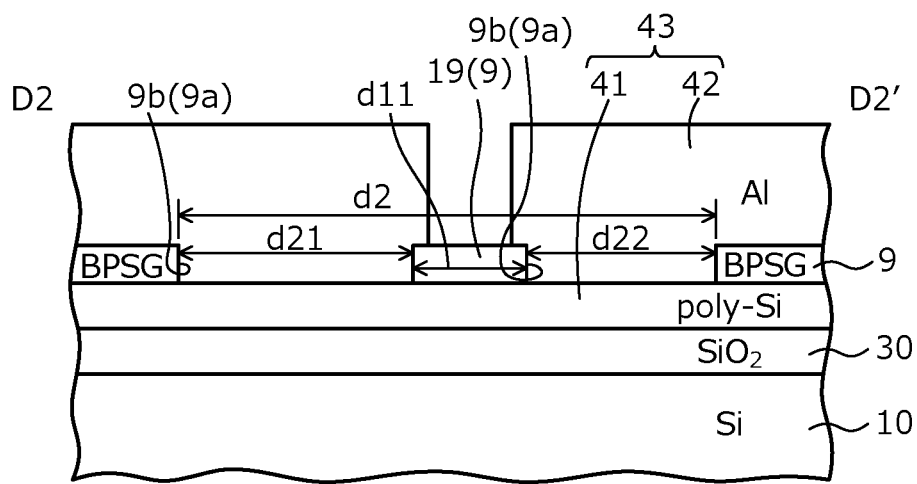
FIG. 10 is a cross-sectional view of the gate wiring layer in FIG. 7.
Figure 11:
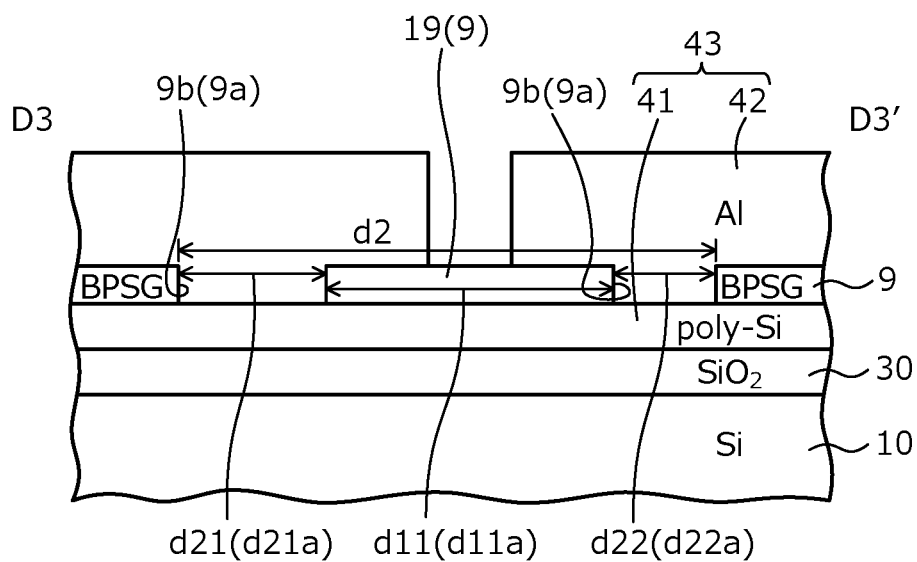
FIG. 11 is a cross-sectional view of the gate wiring layer in FIG. 7.

Next, a structure of a semiconductor device according to a second embodiment is described. FIG. 7 is a plan view of a state when the semiconductor device according to the second embodiment is viewed from the front side of the semiconductor substrate. FIGS. 8, 10, and 11 are cross-sectional views of the gate wiring layer in FIG. 7. FIGS. 8, 10, and 11 respectively depict cross-sections along cutting line D1-D1', cutting line D2-D2', and cutting line D3-D3' parallel to the circumferential direction in which a first gate wiring layer 43 extends. FIG. 9 is a cross-sectional view depicting another example of the structure along cutting line D1-D1' in along FIG. 7.

Here, while the cross-sections depicted in FIGS. 8 to 11 are assumed to be along cutting line D1-D1', cutting line D1-D1', cutting line D2-D2', and cutting line D3-D3', respectively, parallel to the first direction X, the first direction X, the second direction Y, and the first direction X, respectively, in FIG. 7, configuration is not limited hereto. Arrangement of the portions having the structure of the first gate wiring layer 43 depicted in FIGS. 8 to 11 is variously changed in the adjustment of the parasitic gate resistance value due to the first gate wiring layer 43, between multiple IGBT regions 23 and between the unit cells of a single IGBT region 23, similarly to the first embodiment.

A semiconductor device 40 according to the second embodiment differs from the semiconductor device 20 according to the first embodiment (refer to FIGS. 1 to 6) in that an insulating film 19 that partially electrically insulates a polysilicon wiring layer 41 and metal wiring layers 42 configuring the first gate wiring layer 43 is disposed. In at least one contact hole 9a, the insulating film (hereinafter, separating insulation film) 19 that separates the contact hole 9a into multiple openings 9b is disposed. The separating insulation film 19 need not be disposed in the contact hole 9a that is furthest from the gate pad 12 (FIG. 8).

The separating insulation film 19 is disposed in a contact hole 9a that is relatively close to the gate pad 12 (FIGS. 10, 11). The separating insulation film 19, for example, is a portion of the interlayer insulating film 9. The separating insulation film 19 divides the contact hole 9a so that the contact hole 9a is configured by the multiple openings 9b (here, 2) arranged in the circumferential direction of the first gate wiring layer 43. The closer is the separating insulation film 19 to the gate pad 12, the longer is a length of the separating insulation film 19 extending in the circumferential direction of the first gate wiring layer 43 (hereinafter, simply, length) d11.

For example, the length d11 of each of the separating insulation films 19 disposed in one contact hole 9a, or the length d11 of each of the separating insulation films 19 respectively disposed in different contact holes 9a is longer the closer the respective separating insulation film 19 is to the gate pad 12, or the length d11 of the separating insulation film 19 may be set so as to satisfy both. For example, in FIGS. 10 and 11, in the contact holes 9a in which the separating insulation films 19 are disposed, the separating insulation films 19 are disposed respectively, and a position closer to the gate pad 12 than is a position in FIG. 10 is depicted in FIG. 11.

A length d11a of the separating insulation film 19 in the contact hole 9a relatively close to the gate pad 12 depicted in FIG. 11 is longer than the length d11 of the separating insulation film 19 in the contact hole 9a relatively further from the gate pad 12 depicted in FIG. 10. Further, in the same contact hole 9a, opening lengths d21, d22 of the multiple openings 9b (here, 2) divided by the separating insulation film 19 may be relatively shorter the closer the openings 9b are to the gate pad 12 relatively (d22<d21).

The opening lengths d21a, d22a of the openings 9b configuring the contact holes 9a relatively close to the gate pad 12 (FIG. 11) may be shorter than the opening lengths d21, d22 of the openings 9b configuring the contact hole 9a relatively further from the gate pad 12 (FIG. 10) (d22a<d21a<d22<d21). In FIGS. 10 and 11, while the metal wiring layers 42 in contact with the polysilicon wiring layer 41 in each of the openings 9b of the contact holes 9a are depicted separate from one another, the metal wiring layers 42 may be continuous on the separating insulation film 19.

In this manner, the separating insulation film 19 is disposed, whereby the resistance value per unit volume of the first gate wiring layer 43 becomes relatively low in the contact holes 9a relatively far from the gate pad 12 (FIG. 8), and relatively high in the contact holes 9a relatively close to the gate pad 12 (FIG. 11). Further, the resistance value per unit volume of the first gate wiring layer 43 is a substantially intermediate resistance value of a portion having a relatively high resistance value and a portion having a relatively low resistance value in a contact hole 9a between a contact hole 9a relatively far from the gate pad 12 and a contact hole 9a relatively close to the gate pad 12 (FIG. 10).

Further, as depicted in another example in FIG. 9, in the contact hole 9a free of the separating insulation film 19, on the metal wiring layer 42, a metal wiring layer 42a may be further provided. In this instance, only in the contact hole 9a free of the separating insulation film 19, the first gate wiring layer 43 has a 3-layer structure in which the polysilicon wiring layer 41, the metal wiring layers 42, and the metal wiring layer 42a are stacked sequentially. The metal wiring layer 42a may be formed by a same material as that of the metal wiring layers 42. The first gate wiring layer 43 has a relatively lower resistance at a portion where the metal wiring layer 42a is disposed.

As described above, according to the second embodiment, in the contact holes formed in the interlayer insulating film between the polysilicon wiring layer and the metal wiring layer configuring the first gate wiring layer, the polysilicon wiring layer and the metal wiring layer are partially insulated from each other by the separating insulation film, whereby the resistance value of the first gate wiring layer may be adjusted more finely. As a result, effects similar to those of the first embodiment may be obtained.

Figure 12:
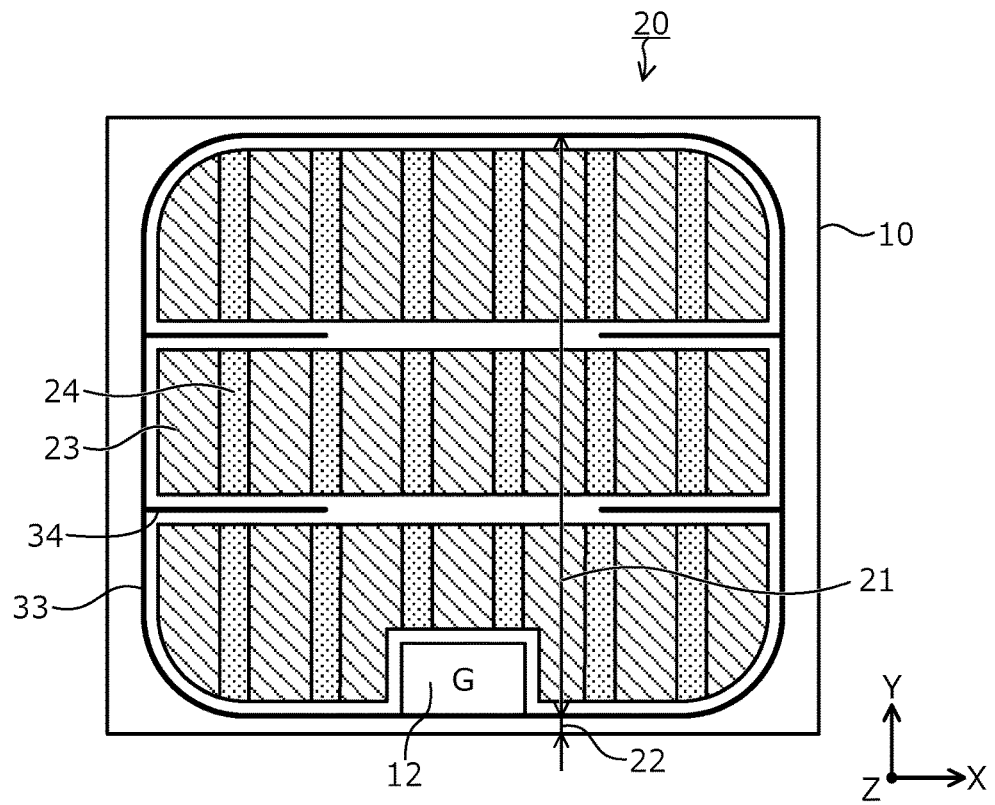
FIG. 12 is a plan view depicting a state when a semiconductor device according to a third embodiment is viewed from the front side of the semiconductor substrate.

Next, as a third embodiment, a configuration for adjusting the parasitic gate resistance value due to the first gate wiring layer 33, between the unit cells of a single IGBT region 23 of the semiconductor device 20 according to the first embodiment is described. FIG. 12 is a plan view depicting a state when the semiconductor device according to the third embodiment is viewed from the front side of the semiconductor substrate. FIG. 13 is an enlarged view of a portion of FIG. 12. In FIG. 13, one of the IGBT regions 23 in FIG. 12 is depicted.

As depicted in FIG. 12, in the active region 21 of the semiconductor substrate 10, for example, sets in which the IGBT regions 23 (portion hatched with diagonal lines) and the FWD regions 24 (portion hatched with dots) are disposed to repeatedly alternate one another in the first direction X parallel to the front surface of the semiconductor substrate 10 are disposed in plural (here, 3) so that the same types of regions face one another across the second gate wiring layer 34 in the second direction Y that is parallel to the front surface of the semiconductor substrate 10 and orthogonal to the first direction X.

A unit cell of the RC-IGBT is configured by one of the IGBT regions 23 and one of the FWD regions 24 adjacent thereto in the first direction X. Most of the IGBT regions 23 and the FWD regions 24 extend parallel to the first direction X and are disposed at positions between gate wiring layers that are adjacent to each other in the second direction Y (between the first and the second gate wiring layers 33, 34, or between the first gate wiring layers 33, or between the second gate wiring layers 34).

For example, in FIG. 13, a layout of the IGBT region 23 (rectangle) near an upper corner portion of the active region 21 in FIG. 12 is depicted, and the IGBT region 23 is disposed at a position sandwiched between the first and the second gate wiring layers 33, 34 (horizontal lines) that are adjacent to one another in the second direction Y. In FIG. 13, a state in which the first and the second gate wiring layers 33, 34 are interchanged is a layout of the IGBT regions 23 near lower corners of the active region 21 in FIG. 12.

In FIG. 13, a state in which both the upper gate wiring layer and the lower gate wiring layer of the IGBT region 23 are the second gate wiring layers 34 is a layout of the IGBT regions 23 near the edge voltage withstanding structure region 22 in the first direction X excluding the corners of the active region 21 in FIG. 12. The IGBT regions 23 near the center of the active region 21 in FIG. 12 face other IGBT regions 23 in the second direction Y without being sandwiched by the second gate wiring layers 34.

In FIG. 13, a state in which the gate wiring layer is disposed only on an upper side or a lower side of the IGBT region 23, and the gate wiring layer is the first gate wiring layer 33 is a layout of the IGBT regions 23 near the edge voltage withstanding structure region 22 in the second direction Y excluding the corners of the active region 21 in FIG. 12. In these layouts of the IGBT region 23, states in which the IGBT region 23 is replaced by the FWD region 24 are layouts of the FWD region 24.

In all of the IGBT regions 23 and in all of the FWD regions 24, the trenches 6 (vertical lines) are disposed in a striped pattern in the second direction Y. In the trenches 6, as described above, the gate electrodes 8 are respectively provided via the insulating films 7, respectively (not depicted in FIG. 13, refer to FIG. 2). For each of the gate electrodes 8, the ends there of are connected to the first and the second gate wiring layers 33, 34 that, in the second direction Y, are adjacent to the region (the IGBT region 23, the FWD region 24) in which said gate electrode 8 is disposed.

The gate electrodes 8 of the IGBT regions 23 and the FWD regions 24 near the center of the active region 21 are respectively connected to the gate electrodes 8 of IGBT regions 23 and FWD regions 24 facing, in the second direction Y without the second gate wiring layer 34 intervening therebetween, the IGBT regions 23 and the FWD regions 24 near the center of the active region 21. The gate electrodes 8 of the IGBT regions 23 and the FWD regions 24 in portions excluding the corners of the active region 21 and near the edge voltage withstanding structure region 22 in the second direction Y have one end connected to the first gate wiring layer 33.

In sections of the first gate wiring layer 33 facing the IGBT regions 23 in the second direction Y, the contact holes 9a of the interlayer insulating film 9 between the polysilicon wiring layer 31 and the metal wiring layer 32 (refer to FIGS. 3 to 6) are partially disposed and the resistance value of the first gate wiring layer 33 is partially adjusted. As a result, between the unit cells of the IGBT regions 23 facing the first gate wiring layer 33 in the second direction Y, the parasitic gate resistance value due to the first gate wiring layer 33 may be adjusted.

For example, of the unit cells in a single IGBT region 23, in the unit cells having gate electrodes 8 that pass near the center of the IGBT region 23, heat stress and dV/dt during turn OFF of the IGBT becomes relatively high. Therefore, the resistance value of the first gate wiring layer 33 (resistance value of wiring resistance) is increased in portions where the gate electrodes 8 that pass near the center of the IGBT region 23 are connected and is reduced with increasing distance from these portions (FIG. 13).

In this instance, the contact hole 9a may be provided in the interlayer insulating film 9 so that the contact area between the polysilicon wiring layer 31 and the metal wiring layer 32 decreases at portions of the first gate wiring layer 33 where the gate electrodes 8 that pass near the center of the IGBT region 23 are connected thereto. In the contact hole 9a of the interlayer insulating film 9 in the section of the first gate wiring layer 33 facing the IGBT region 23 in the second direction Y, the separating insulation film 19 of the second embodiment (refer to FIGS. 10 and 11) may be disposed.

As described above, according to the third embodiment, effects similar to those of the first and the second embodiments may be obtained. Further, according to the third embodiment, by increasing the resistance value of portions of the first gate wiring layer in the sections that face the IGBT region in the second direction, between the unit cells of a single IGBT region, the parasitic gate resistance value due to the first gate wiring layer is adjusted. As a result, differences in the gate potential between the unit cells of the single IGBT region may be reduced.

In the foregoing, the present invention is not limited to the embodiments described above and various modifications within a range not departing from the spirit of the invention are possible. For example, the first gate wiring layer suffices to be configured having, at predetermined portions, a relatively large amount of the metal wiring layer with a lower resistance value than that of the polysilicon wiring layer, and may have a layered structure in which the polysilicon wiring layer is stacked on the metal wiring layer. Further, the first gate wiring layer is not limited to the 2-layered structure in which the polysilicon wiring layer and the metal wiring layer containing aluminum are sequentially stacked and suffices to be a multilayered structure in which at least two conductive layers having differing resistance values are stacked.

Further, the opening width (width in direction of normal) of the contact holes in which the polysilicon wiring layer and the metal wiring layer are in contact with each other is relatively wide at portions separate from the gate pad and relatively narrow a portions near the gate pad, whereby the resistance value of the first gate wiring layer may be adjusted. In this instance, at the entire periphery of the first gate wiring layer, contact holes in which the polysilicon wiring layer and the metal wiring layer are in contact with each other may be formed and the opening width of the contact holes may be wider with increasing distance from the gate pad. Further, the present invention is similarly implemented when the conductivity types (n-type, p-type) are reversed.

According to the invention described above, between multiple unit cells connected in parallel, the parasitic gate resistance value due to the gate wiring layer may be adjusted. Therefore, the gate voltage is substantially uniform during turn OFF, and in a state in which the gate voltage is reduced to about the gate threshold voltage, all of the unit cells may be turned OFF. As a result, during turn OFF, in a state in which the gate voltage is reduced to about the gate threshold voltage, a state in which some of the unit cells are ON does not occur.

The semiconductor device according to the invention achieves an effect in that imbalance of energizing current at the surface of the semiconductor substrate may be suppressed.

As described above, the semiconductor device according to the present invention is useful for power semiconductor devices used in power converting equipment, power source devices such as in various industrial machines, etc.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A semiconductor device, comprising:
   a semiconductor substrate having a main surface and an active region;
   a plurality of unit cells provided in the active region of the semiconductor substrate, each having a respective one of a plurality of insulated gates, formed by a metal, an oxide film, and a semiconductor; and
   a gate wiring layer to which the insulated gates of all of the unit cells are electrically connected, the gate wiring layer being provided on the main surface of the semiconductor substrate via an insulating layer, surrounding a periphery of the active region, wherein
   the gate wiring layer is a multilayered structure including a first conductive layer having a first resistance value, a second conductive layer having a second resistance value that differs from the first resistance value, and an interlayer insulating film provided between the first and second conductive layers, the interlayer insulating film having one or more contact holes, each contact hole partially exposing the first conductive layer from the interlayer insulating film,
   the first and second conductive layers face each other in a depth direction, are in direct contact with each other via the one or more contact holes, and are electrically insulated from each other by the interlayer insulating film in an area where no contact hole is disposed, wherein along the gate wiring layer, at least one of the one or more contact holes is disposed discontinuously in the gate wiring layer extends, and
   a resistance value of the gate wiring layer is relatively low in areas where the one or more contact holes are disposed and relatively high in the area where no contact hole is disposed.

2. The semiconductor device according to claim 1, wherein
   the resistance value of the gate wiring layer is set so as to reduce a gate voltage difference between all of the unit cells connected in parallel.

3. The semiconductor device according to claim 1, further comprising
   a gate pad to which the gate wiring layer is electrically connected, provided on the main surface of the semiconductor substrate, wherein
   the one or more contact holes are each disposed separate from the gate pad.

4. The semiconductor device according to claim 3, wherein
   the one or more contact holes include a plurality of contact holes, distances to the gate pad from respective positions at which the plurality of contact holes are disposed being different from one another, each contact hole having an opening width in a direction orthogonal to the direction in which the gate wiring layer extends at a position where said each contact hole is disposed, and
   the opening width of said each contact hole is set smaller with decreases in the distance from the gate pad.

5. The semiconductor device according to claim 3, wherein
   the one or more contact holes include a plurality of contact holes, distances to the gate pad from respective positions at which the plurality of contact holes are disposed being different from one another, each contact hole having a first opening length in the direction in which the gate wiring layer extends at a position where said each contact hole is disposed, and
   the first opening length of said each contact hole is set smaller with decreases in the distance from the gate pad.

6. The semiconductor device according to claim 3, further comprising
   in each contact hole, a separating insulation film that divides said each contact hole into a plurality of openings, each opening having a second opening length and being arranged in the direction in which the gate wiring layer extends at a position where said each contact hole is disposed, wherein
   the second opening length of said each opening in said each contact hole is set smaller with decreases in a distance from the gate pad.

7. The semiconductor device according to claim 1, wherein
   the plurality of unit cells includes first unit cells each forming a corresponding insulated-gate bipolar transistor and second unit cells each forming a corresponding diode, so that the plurality of unit cells comprises a plurality of insulated-gate bipolar transistors and a plurality of diodes, each diode being connected in antiparallel to a respective one of the plurality of insulated-gate bipolar transistors, the active region has:
- a first device element region in which the first unit cells that form the insulated-gate bipolar transistors are disposed, and
- a second device element region adjacent to the first device element region and in which the second unit cells that form the diodes are disposed, and the gate wiring layer includes a facing area that faces the first device element region, the facing area having the areas in which the resistance values of the gate wiring layer are either relatively low or high.

8. The semiconductor device according to claim 7, wherein
- the first device element region and the second device element region are arranged in a first direction,
- the facing area of the gate wiring layer extends in a linear shape in the first direction that is parallel to the main surface of the semiconductor substrate,
- the insulated gates extend in a striped pattern in a second direction parallel to the main surface of the semiconductor substrate and orthogonal to the first direction,
- ends of the insulated gates are connected to the facing area of the gate wiring layer, and
- the resistance value of the gate wiring layer is higher at a center of the facing area measured in the first direction than at the rest of the facing area.

9. The semiconductor device according to claim 1, wherein the multilayer structure includes more than two conductive layers having the first and second conductive layers, and the interlayer insulating film is provided in plurality in the multilayer structure, the conductive layers being alternately stacked with the interlayer insulating films.

* * * * *